US008318569B2

(12) United States Patent
Lee

(10) Patent No.: US 8,318,569 B2
(45) Date of Patent: Nov. 27, 2012

(54) FORMING MEMORY CELLS COMPRISING IMPURITY DOPING REGIONS ALONG EDGES OF LESS THAN 1F SPACING

(75) Inventor: Tae-hee Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 506 days.

(21) Appl. No.: 12/627,840

(22) Filed: Nov. 30, 2009

(65) Prior Publication Data

US 2010/0136763 A1    Jun. 3, 2010

(30) Foreign Application Priority Data

Dec. 1, 2008  (KR) .................. 10-2008-0120683

(51) Int. Cl.
*H01L 21/336* (2006.01)
(52) U.S. Cl. ......... 438/301; 438/268; 438/514; 257/327
(58) Field of Classification Search .................. None
See application file for complete search history.

(56) References Cited

U.S. PATENT DOCUMENTS

| 7,341,904 | B2* | 3/2008 | Willer ........................ 438/199 |
| 7,626,230 | B2* | 12/2009 | Joo et al. ..................... 257/330 |
| 2003/0137063 | A1 | 7/2003 | Song et al. |
| 2005/0054160 | A1* | 3/2005 | Lojek ........................ 438/257 |
| 2006/0258089 | A1* | 11/2006 | Chung-Zen ................. 438/257 |
| 2007/0070708 | A1* | 3/2007 | Ichige et al. ............. 365/185.28 |
| 2008/0089127 | A1* | 4/2008 | Mokhlesi et al. ......... 365/185.17 |
| 2008/0099850 | A1* | 5/2008 | Jeon et al. ..................... 257/365 |
| 2009/0230442 | A1* | 9/2009 | Kim et al. ..................... 257/288 |

FOREIGN PATENT DOCUMENTS

| JP | 2004-273643 | 9/2004 |
| KR | 96-12569 | 4/1996 |
| KR | 1020060074231 A | 7/2006 |

OTHER PUBLICATIONS

Han et al., A Unified-RAM (URAM) Cell for Multi-Functioning Capacitorless DRAM and NVM, Electron Devices Meeting, 2007. IEDM 2007. IEEE International, pp. 929-932.*

* cited by examiner

*Primary Examiner* — Evan Pert
*Assistant Examiner* — Andres Munoz
(74) *Attorney, Agent, or Firm* — Myers Bigel Sibley & Sajovec, P.A.

(57) ABSTRACT

Provided are methods of forming a semiconductor device, the method including: forming an insulation region on a substrate region, and an active region on the insulation region; patterning the active region to form an active line pattern; forming a gate pattern to surround an upper portion and lateral portions of the active line pattern; separating the gate pattern into a plurality of sub-gate regions, and separating the active line pattern into a plurality of sub-active regions, in order to form a plurality of memory cells that are each formed of the sub-active region and the sub-gate region and that are separated from one another; and forming first and second impurity doping regions along both edges of the sub-active regions included in each of the plurality of the memory cells, wherein the forming of the first and second impurity doping regions comprises doping lateral portions of the sub-active regions via a space between the memory cells.

16 Claims, 10 Drawing Sheets

FORMING MEMORY CELLS COMPRISING IMPURITY DOPING REGIONS ALONG EDGES OF LESS THAN 1F SPACING

CROSS-REFERENCE TO RELATED APPLICATIONS

This application claims the benefit of Korean Patent Application No. 10-2008-0120683, filed on Dec. 1, 2008, in the Korean Intellectual Property Office, the disclosure of which is incorporated herein in its entirety by reference.

BACKGROUND

The inventive concept relates to methods of forming a semiconductor apparatus, and more particularly, to methods of forming a semiconductor apparatus with reduced dimensions.

1-T dynamic random access memory (DRAM), which includes a single transistor without including capacitors, is a type of computer memory that has been recently used. A 1-T DRAM not only can be manufactured using a simple process but also has an improved sensing margin.

SUMMARY

According to an aspect of the inventive concept, there is provided a method of forming a semiconductor device, the method comprising limning an insulation region on a substrate region, and an active region on the insulation region; patterning the active region to form an active line pattern; forming a gate pattern to surround an upper portion and lateral portions of the active line pattern; separating the gate pattern into a plurality of sub-gate regions, and separating the active line pattern into a plurality of sub-active regions, in order to form a plurality of memory cells that are formed of the sub-active region and the sub-gate region and that are separated from one another; and forming first and second impurity doping regions along both edges of the sub-active regions included in the plurality of the memory cells, wherein the forming of first and second impurity doping regions comprises doping lateral portions of the sub-active regions via a space between the memory cells.

The method may further comprise filling space between the plurality of the memory cells with contacts and/or plugs. The first impurity doping region and/or the second impurity doping region may be connected through the contacts and/or plugs to be shared by adjacent memory cells.

The forming of first and second impurity doping regions may comprise doping lateral portions of the sub-active regions.

Also, the first and second impurity doping regions may be formed along both edges of the sub-active regions, and so as not to overlap the sub-gate region.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
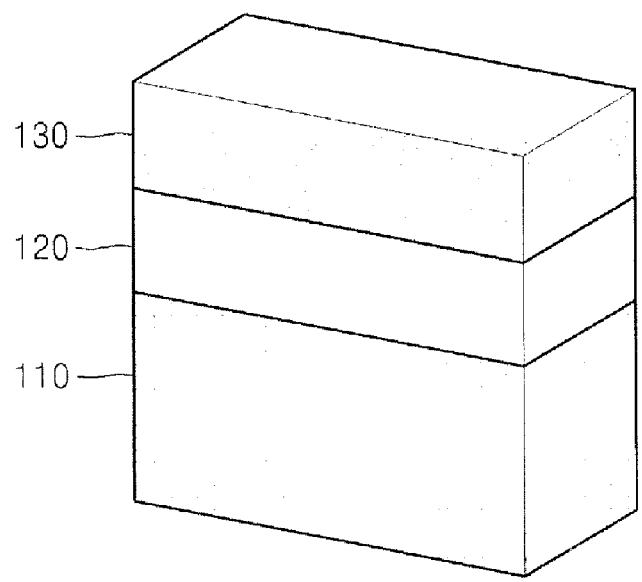
FIGS. 1 through 14 are schematic views illustrating a method of forming a semiconductor apparatus, according to an embodiment of the inventive concept.

The present inventive concept now will be described more fully hereinafter with reference to the accompanying drawings, in which embodiments of the inventive concept are shown. However, this inventive concept should not be construed as limited to the embodiments set forth herein. Rather, these embodiments are provided so that this disclosure will be thorough and complete, and will fully convey the scope of the inventive concept to those skilled in the art. In the drawings, the thickness of layers and regions may be exaggerated for clarity. Like numbers refer to like elements throughout. As used herein the term "and/or" includes any and all combinations of one or more of the associated listed items and may be abbreviated as "/".

The terminology used herein is for the purpose of describing particular embodiments only and is not intended to be limiting of the inventive concept. As used herein, the singular forms "a," "an" and "the" are intended to include the plural forms as well, unless the context clearly indicates otherwise. It will be further understood that the terms "comprises," "comprising," "having," "having," "includes," and/or "including" when used in this specification, specify the presence of stated features, regions, steps, operations, elements, and/or components, but do not preclude the presence or addition of one or more other features, regions, steps, operations, elements, components, and/or groups thereof.

It will be understood that when an element such as a layer or region is referred to as being "on" or extending "onto" another element (or variations thereof), it can be directly on or extend directly onto the other element or intervening elements may also be present. In contrast, when an element is referred to as being "directly on" or extending "directly onto" another element (or variations thereof), there are no intervening elements present. It will also be understood that when an element is referred to as being "connected" or "coupled" to another element (or variations thereof), it can be directly connected or coupled to the other element or intervening elements may be present. In contrast, when an element is referred to as being "directly connected" or "directly coupled" to another element (or variations thereof), there are no intervening elements present.

It will be understood that, although the terms first, second, etc. may be used herein to describe various elements, components, regions, layers and/or sections, these elements, materials, regions, layers and/or sections should not be limited by these terms. These terms are only used to distinguish one element, material, region, layer or section from another element, material, region, layer or section. Thus, a first element, material, region, layer or section discussed below could be termed a second element, material, region, layer or section without departing from the teachings of the present inventive concept.

Relative terms, such as "lower", "back", and "upper" may be used herein to describe one element's relationship to another element as illustrated in the Figures. It will be understood that relative terms are intended to encompass different orientations of the device in addition to the orientation depicted in the Figures. The exemplary term "upper", can therefore, encompasses both an orientation of "lower" and "upper," depending on the particular orientation of the figure. Similarly, if the structure in one of the figures is turned over, elements described as "below" or "beneath" other elements would then be oriented "above" the other elements. The exemplary terms "below" or "beneath" can, therefore, encompass both an orientation of above and below.

Embodiments of the present inventive concept are described herein with reference to cross section and perspective illustrations that are schematic illustrations of idealized embodiments of the present inventive concept. As such, variations from the shapes of the illustrations as a result, for example, of manufacturing techniques and/or tolerances, are to be expected. Thus, embodiments of the present inventive concept should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated, typically, may be rounded. Thus, the regions illustrated in the figures are schematic in nature and their shapes are not intended to illustrate the precise shape of a region and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIGS. 1 through 14 are schematic views illustrating a method of forming a semiconductor device, according to an embodiment of the inventive concept.

Referring to FIG. 1, an insulation region 120 is formed on a substrate region 110, and an active region 130 is formed on the insulation region 120.

The insulation region 120 may be formed of a material containing an oxide. Also, the insulation region 120 may be formed of other insulating materials. The insulation region 120 may be formed on the substrate region 110 formed of a bulk substrate, or may be formed of an insulation region included in a silicon-on-insulator (SOI) substrate.

Figure 2:
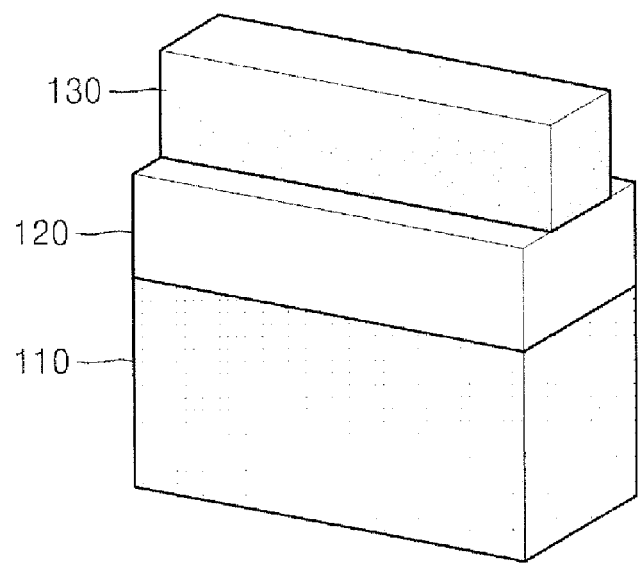

Referring to FIG. 2, the active region 130 is etched to form an active line pattern P130. For example, the active region 130 may be etched from both upper edges thereof to a predetermined width and a predetermined length, thereby forming an active line pattern P130 on a center portion of the insulation region 120 in a length direction.

Figure 3:
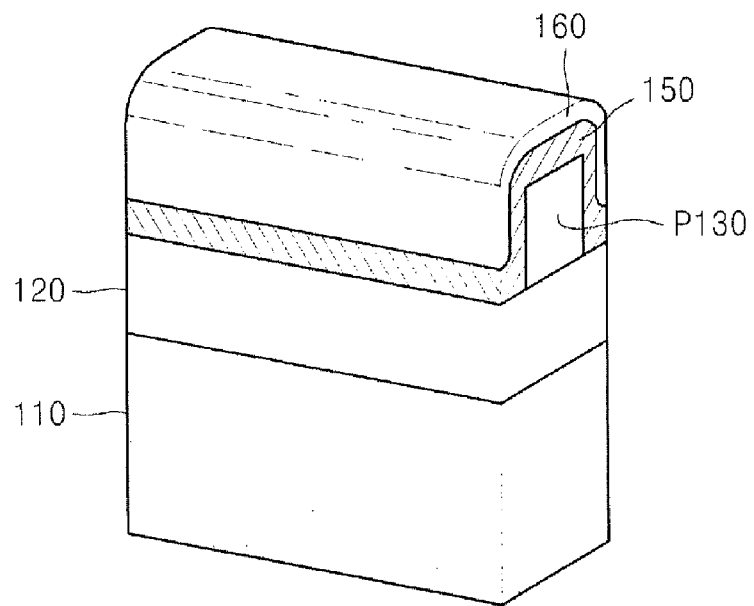

Referring to FIG. 3, a gate pattern 150 and a gate upper pattern 160 are formed on the active line pattern P130 to surround an upper portion and both lateral portions of the active line pattern P130 (deposition).

Figure 4:
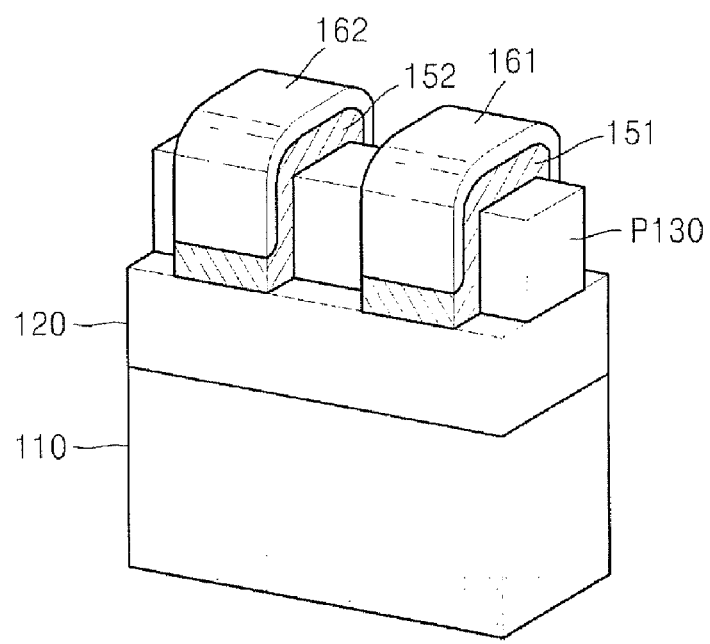

Referring to FIG. 4, the gate pattern 150 and the gate upper pattern 160 are patterned. As a result, the gate pattern 150 is separated into a first sub-gate region 151 and a second sub-gate region 152, and the gate upper pattern 160 is separated into a first sub-gate upper region 161 and a second sub-gate upper region 162.

Figure 5:
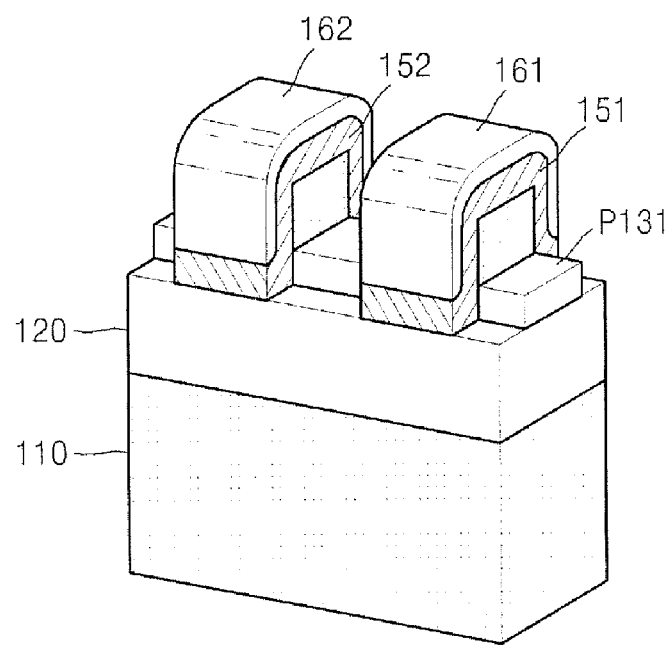

Referring to FIG. 5, a portion of the active line pattern P130 exposed outside the first and second sub-gate regions 151/152 and the first and second sub-gate upper regions 161/162 is etched (active recess). As a result, a recess active pattern P131 is formed. In this regard, exposed portions of the active line pattern P130 may be patterned. In other words, portions of the active line pattern P130 that are not covered by the first and second sub-gate regions 151 and 152 and the first and second sub-gate upper regions 161 and 162 may be patterned. In the recess active pattern P131, patterned portions which are lower than other portions may be regarded as recessed portions.

Figure 6:
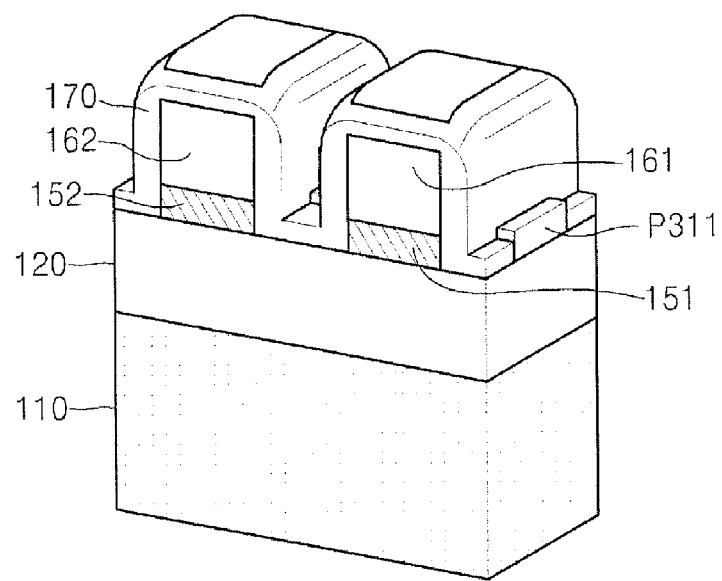

Referring to FIG. 6, a spacer 170 covering the first and second sub-gate regions 151 and 152 and the first and second sub-gate upper regions 161 and 162 is formed. Part of the recessed portions P131 in FIG. 5 is not covered but exposed to provide recessed portions P311.

Figure 7:
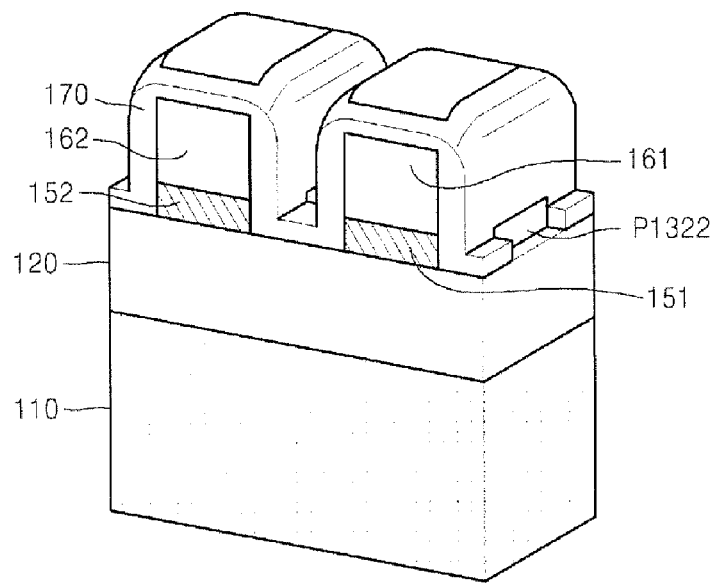

Referring to FIG. 7, the recessed portions P311, which are not covered by the spacer 170 but exposed, is etched partially to be separated into a plurality of sub-active regions. Reference numeral P1322 refers to a portion of a sub-active region. The separation of the recess active pattern 131 into a plurality of sub-active regions are described in greater detail with reference to FIG. 8.

Figure 8:
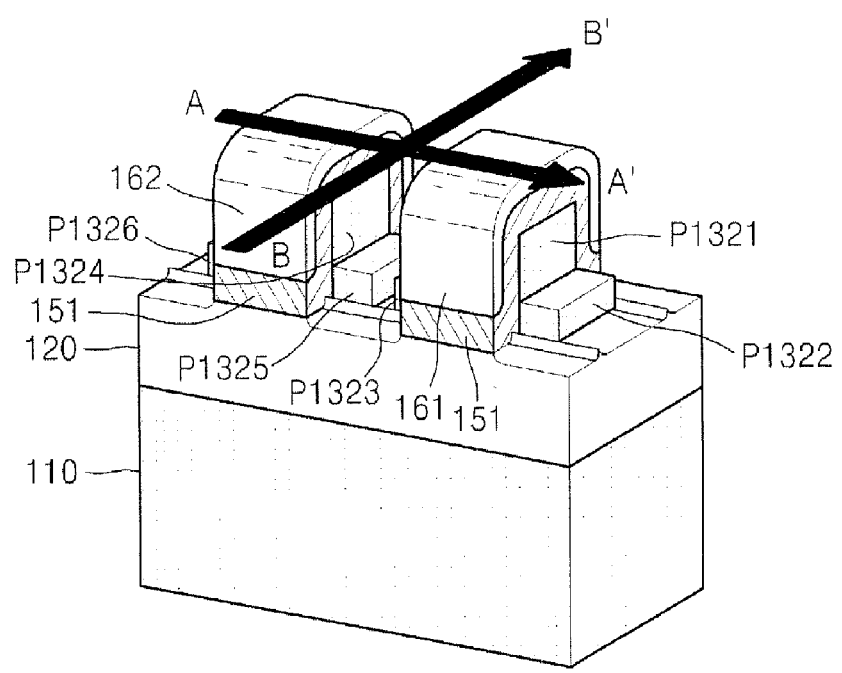

FIG. 8 is a schematic view of the semiconductor apparatus in which the spacer 170 is not illustrated. In other words, the spacer 170 is not shown for simplicity but it actually present in some embodiments.

Figure 9:
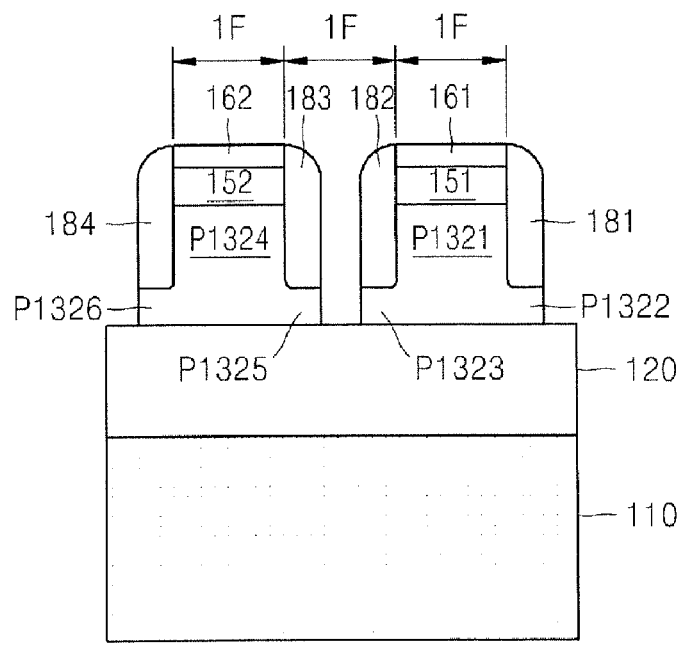

Referring to FIG. 8, patterns P1321, P1322, and P1323 form one sub-active region, and patterns P1324, P1325, and P1326 form another sub-active region. The pattern P1321 is a body portion of the sub-active region, and the patterns P1322 and P1323 are lateral portions of the sub-active region. One sub-active region formed of the patterns P1321, P1322, and P1323 is spaced apart a predetermined distance from the other sub-active region formed of the patterns P1324, P1325, and P1326. That is, the pattern P1323 is spaced apart a predetermined distance from the pattern P1325 as illustrated in FIG. 9. FIG. 9 is a cross-sectional view cut along a line A-A' in FIG. 8.

Referring to FIGS. 8 and 9, the sub-active region formed of the patterns P1321, P1322, and P1323 and the sub-gate region 151 may form one memory cell for example. In this case, two memory cells illustrated in FIGS. 8 and 9 are spaced apart a predetermined distance from each other. For example, the distance between the memory cells may be 1F. Also, a width of each of the memory cells may be 1F.

Referring to FIG. 9, the patterns P1322 and P1323 and the patterns P1325 and P1326, which are lateral portions of the sub-active regions, are covered by sidewalls 181 and 182 and sidewalls 183 and 184, respectively.

Figure 10:
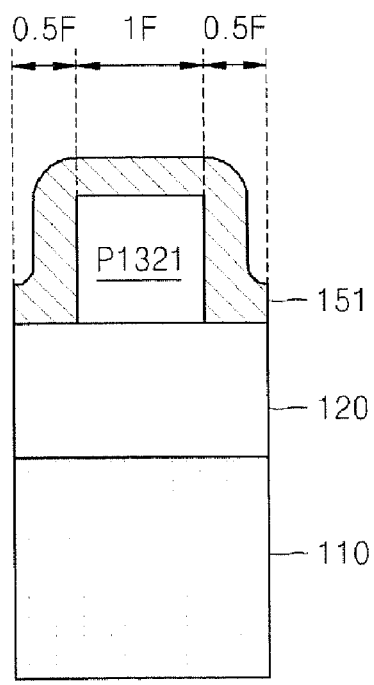

FIG. 10 is a cross-sectional view of the semiconductor apparatus cut along a line B-B' in FIG. 8.

In FIG. 10, a width of the pattern P1321 of the sub-active region is 1F, and a width of the sub-gate region 151 is 2F.

Figure 11:
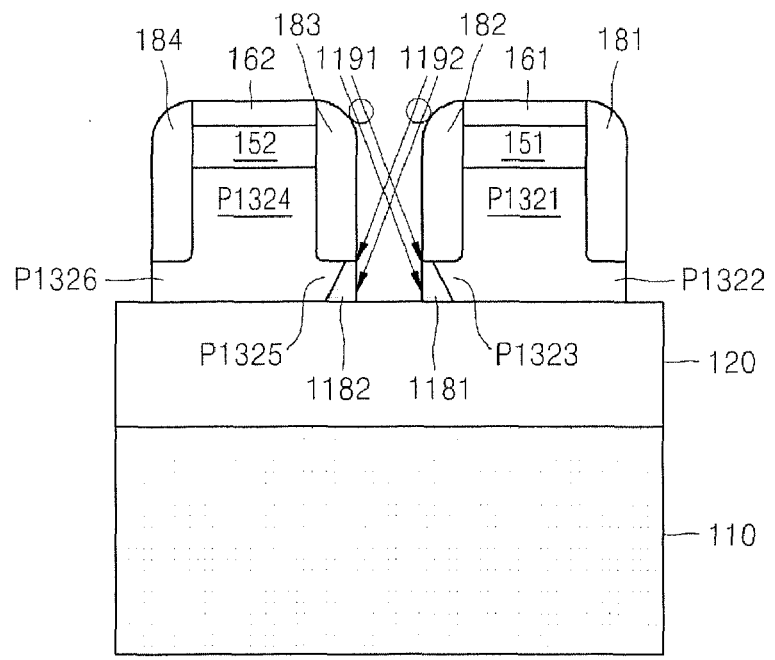

FIG. 11 is a schematic view for explaining formation of impurity regions in the lateral portions of the sub-active region. In FIG. 11, impurity doping paths 1191 and 1192 for forming impurity regions in the lateral portions of the sub-active region are illustrated.

Referring to FIG. 11, impurity doping regions 1181 and 1182 are formed in lateral portions of the patterns P1323 and P1325 of the sub-active regions, at both edges of the patterns P1323 and P1325. In detail, the impurity doping regions 1181 and 1182 are formed by doping the lateral portions of the patterns P1323 and P1325 using a low energy source and at a low tilt angle. As described above, the impurity doping paths 1191 and 1192 for doping the patterns P1323 and P1325 at a low tilt angle are formed.

When using the impurity doping paths 1191 and 1192 illustrated in FIG. 11, the impurity doping regions 1181 and 1182 may be formed as walls at both edges of the patterns P1323 and P1325. That is, the impurity doping regions 1181 and 1182 may cover the entire lateral portions of the patterns P1323 and P1325 at the edges of the patterns P1323 and P1325.

The impurity doping regions 1181 and 1182 may be formed to be narrow along the edges of the patterns P1323 and P1325 so as not to overlap the sub-gate regions 151 and 152. A horizontal length of the impurity doping regions 1181 and 1182 may be shorter than a vertical length thereof. Since the impurity doping regions 1181 and 1182 are formed along the edges of the patterns P1323 and P1325, a vertical length of the impurity doping regions 1181 and 1182 may be substantially the same as a vertical length of the patterns P1323 and P1325. On the other hand, the horizontal length of the impurity doping regions 1181 and 1182 may be shorter than the vertical length of the impurity doping regions 1181 and 1182 or than the vertical length of the patterns P1323 and P1325.

In addition, the horizontal length of the impurity doping regions 1181 and 1182 may increase in a vertical downward direction. That is, an upper horizontal length of the impurity doping regions 1181 and 1182 may be shorter than a lower horizontal length thereof. A cross-section of each of the impurity doping regions 1181 and 1182 may be a rectangle having an upper horizontal length shorter than a lower horizontal length or may be a triangle having a horizontal length increasing in the vertical downward direction. Also, the impurity density of the impurity doping regions 1181 and 1182 may be uniform in the vertical direction, or the ratio of a maximum impurity density of the impurity doping regions 1181 and 1182 to a minimum impurity density may be 10:1 or less in the vertical direction.

As described above, since the impurity doping regions 1181 and 1182 are formed by doping the lateral portions of the patterns P1323 and P1325 at a low tilt angle, the impurity doping regions 1181 and 1182 may also be formed in the patterns P1323 and P1325 when a distance between the patterns P1323 and P1325 is relatively short. For example, the impurity doping regions 1181 and 1182 may be formed while reducing the distance between the patterns P1323 and P1325 or the distance between the memory cells up to 1F.

Figure 12:
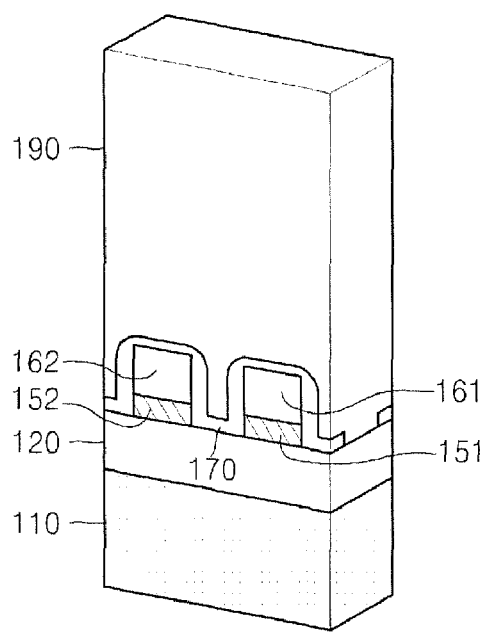

Referring to FIG. 12, an interlayer dielectric (ILD) layer 190 may be formed in a space between the memory cells.

Figure 13:
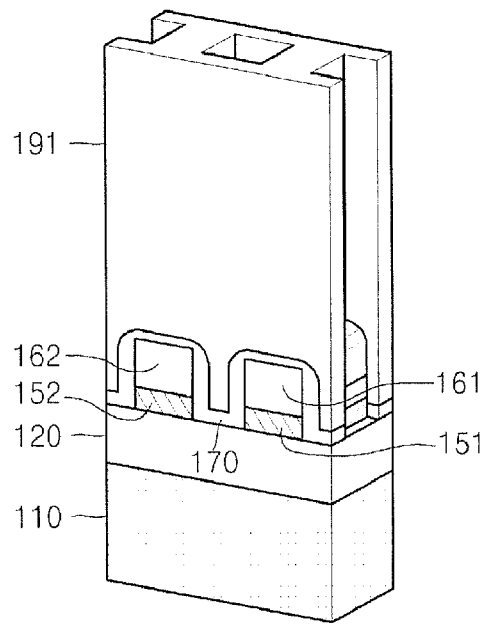
Figure 14:
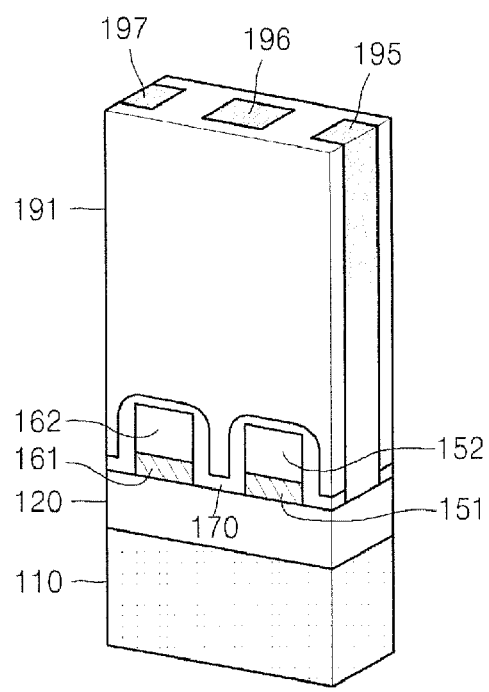

Referring to FIGS. 13 and 14, portions of the ILD layer 190 may be etched and filled with contacts or plugs.

Figure 15:
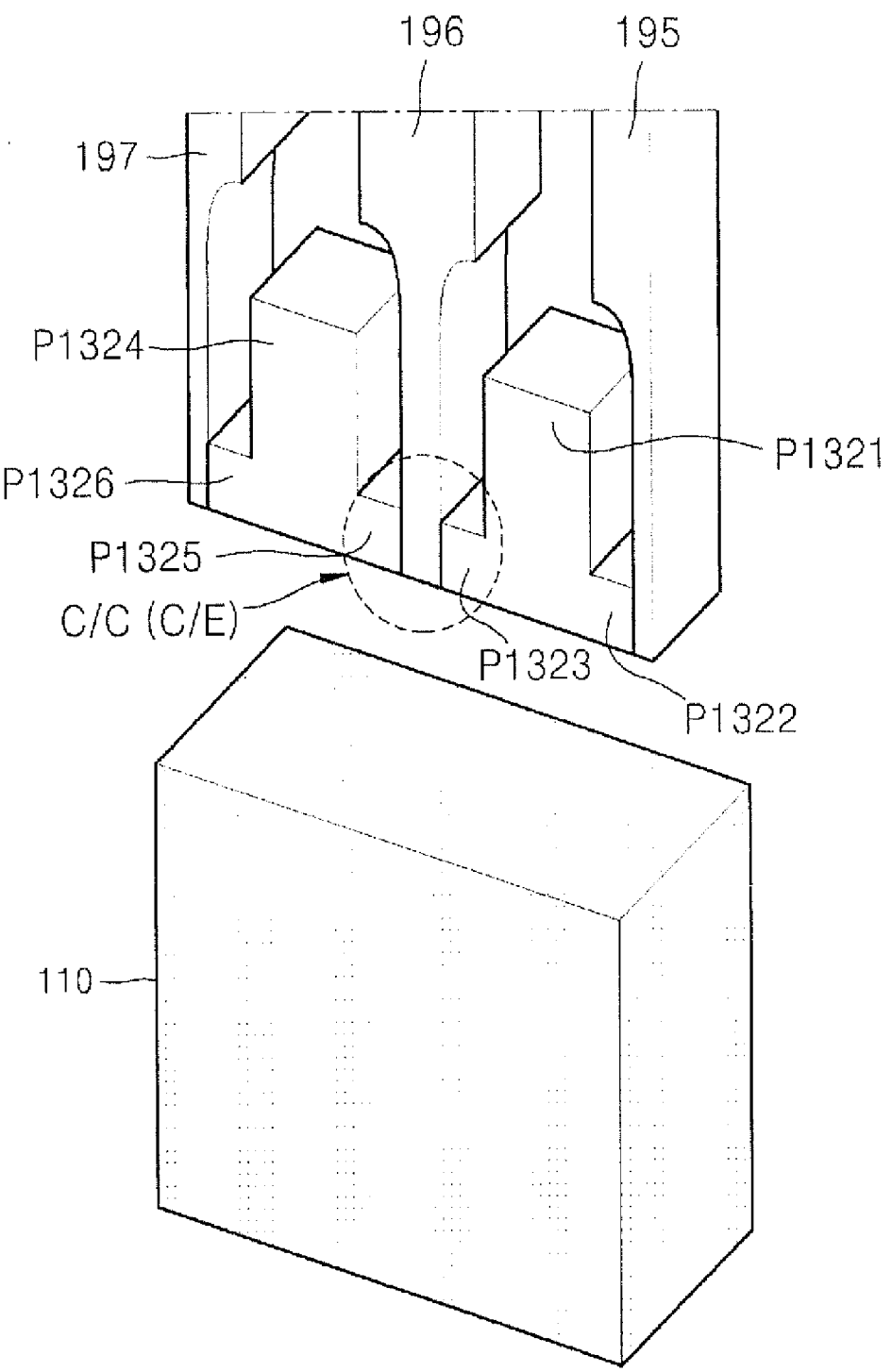
FIG. 15 illustrates contacts and plugs formed between patterns of a semiconductor apparatus manufactured using the method of FIGS. 1 through 14, according to an embodiment of the inventive concept.

FIG. 15 illustrates contacts or plugs formed between patterns of the semiconductor apparatus.

Referring to FIG. 15, a plurality of contacts or plugs 195, 196, and 197 are formed. For example, as a contact or plug 196 is formed between the patterns P1322 and P1323 and the patterns P1325 and P1326, the patterns P1323 and 1325 may be connected to each other. A common collector (C/C) or a common emitter (C/E) is shared by two memory cells. Also, according to the current embodiment of the inventive concept, a distance between the memory cells can be reduced as described with reference to FIG. 11. For example, a distance between the memory cells is assumed to be 1F. In this case, a common collector (C/C) or a common emitter (C/E) shared by the two memory cells may be formed within a distance of 1F or less between the memory cells. Accordingly, when both a collector and an emitter are shared between adjacent memory cells, the size of one memory cell can be reduced up to 4F2. In addition, when only a collector or an emitter is shared between adjacent memory cells, the size of one memory cell can be reduced up to 6F2.

Figure 16:
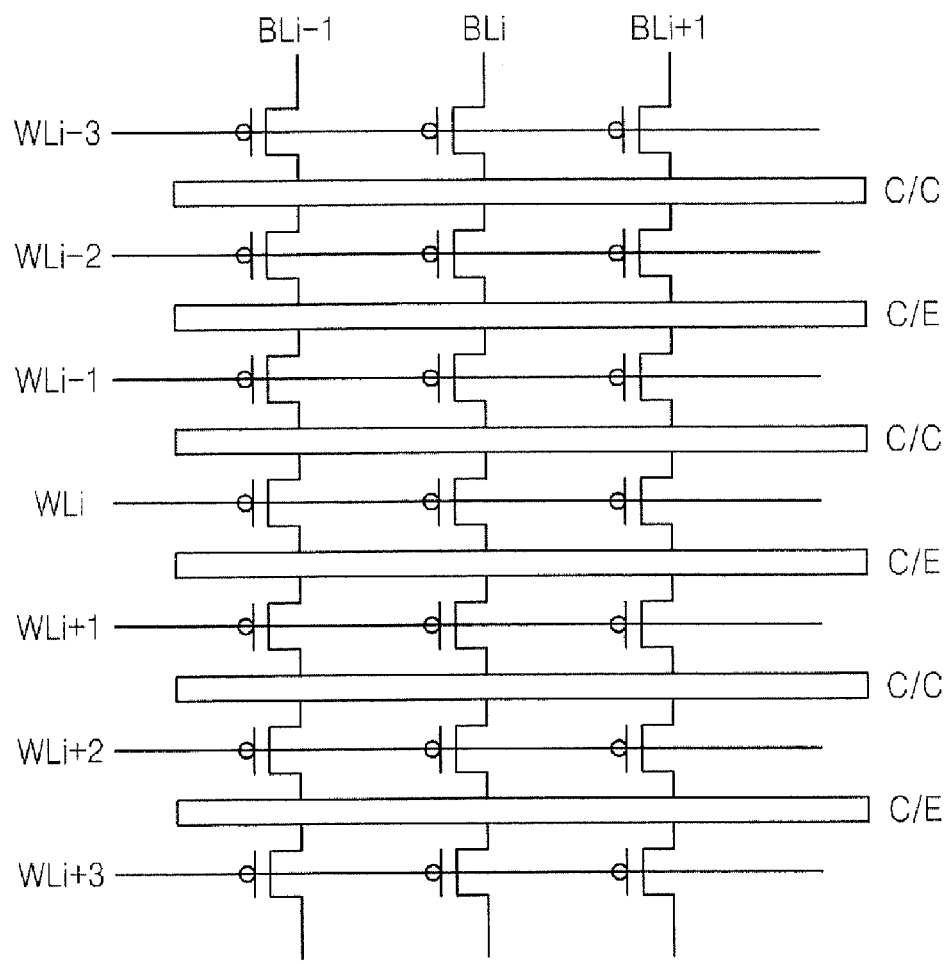
FIG. 16 is a circuit diagram of a case in which a collector and an emitter are both shared between adjacent memory cells.

FIG. 16 is a circuit diagram of a case in which a collector and an emitter are both shared between adjacent memory cells.

Figure 17:
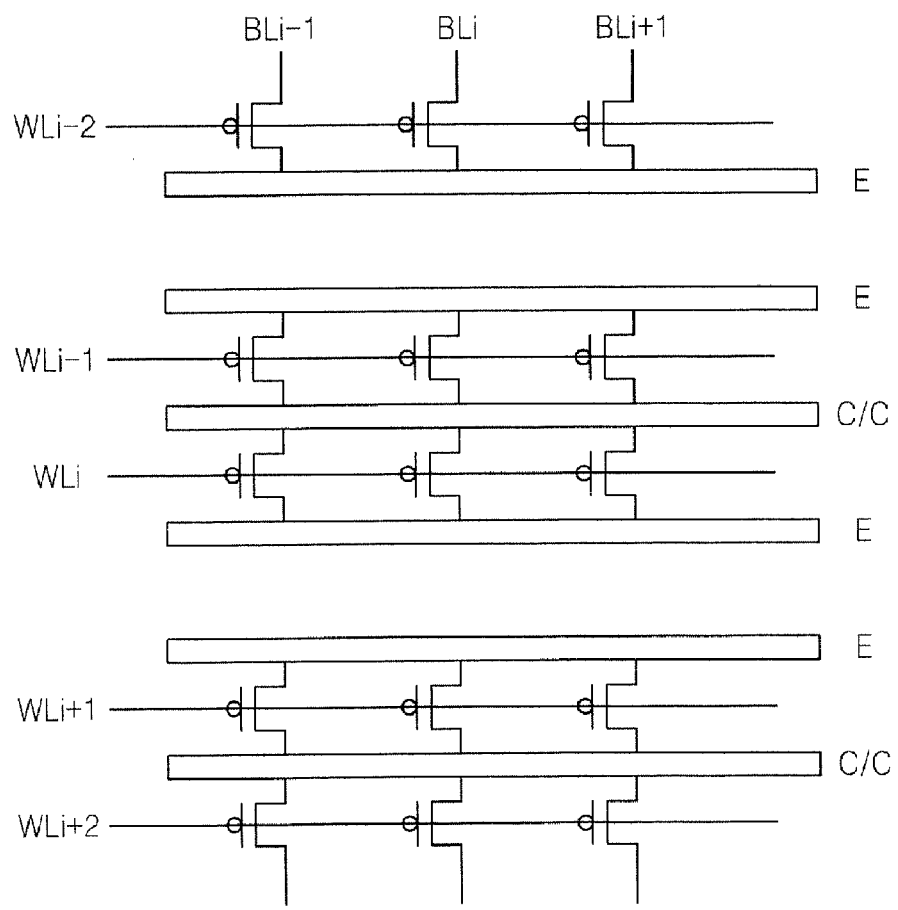
FIG. 17 is a circuit diagram of a case in which a collector or an emitter is shared between adjacent memory cells.

FIG. 17 is a circuit diagram of a case in which a collector or an emitter is shared between adjacent memory cells.

While the inventive concept has been particularly shown and described with reference to exemplary embodiments thereof, the terminology used herein is for the purpose of describing particular embodiments only and is not intended to be limiting of example embodiments. Accordingly, it will be understood by those of ordinary skill in the art that various changes in form and details may be made therein without departing from the spirit and scope of the inventive concept. Therefore, the scope of the inventive concept is defined not by the detailed description of the inventive concept but by the appended claims.

What is claimed is:

1. A method of forming a semiconductor device, the method comprising:
   forming first and second impurity doping regions along both edges of sub-active regions included in a plurality of the memory cells, wherein the forming of first and second impurity doping regions comprises doping lateral portions of the sub-active regions via a space between the memory cells so that the space comprises less than 1F.

2. A method of forming a semiconductor device, the method comprising:
   forming an insulation region on a substrate region, and an active region on the insulation region;
   patterning the active region to form an active line pattern;
   forming a gate pattern to surround an upper portion and lateral portions of the active line pattern;
   separating the gate pattern into a plurality of sub-gate regions, and separating the active line pattern into a plurality of sub-active regions, in order to form a plurality of memory cells that are formed of the sub-active regions and the sub-gate regions and that are separated from one another; and
   forming first and second impurity doping regions along both edges of the sub-active regions included in the plurality of the memory cells,
   wherein the forming of the first and second impurity doping regions comprises doping lateral portions of the sub-active regions via a space between the memory cells.

3. The method of claim 2, wherein the plurality of the memory cells are separated from one another by less than 1F.

4. The method of claim 2, wherein the forming of the plurality of memory cells comprises:
   separating the gate pattern into the plurality of sub-gate regions by patterning the gate pattern at predetermined intervals;
   etching the active line pattern which is exposed between the plurality of the sub-gate regions to a predetermined thickness;
   forming a spacer covering an exposed portion of the active line pattern; and
   separating the active line pattern into the plurality of sub-active regions by etching a portion of the active line pattern that is not covered by the spacer and the sub-gate regions.

5. The method of claim 4, wherein, in the separating of the gate pattern into a plurality of sub-gate regions, the gate pattern is patterned at intervals of 1.0 F, and in the separating of the active line pattern into a plurality of sub-active regions, the active line pattern is patterned at intervals of 1.0 F.

6. The method of claim 2, further comprising filling the space between the plurality of the memory cells with contacts.

7. The method of claim 6, wherein the filling of the space between the plurality of the memory cells with contacts, comprises:
  forming an interlayer dielectric (ILD) layer surrounding the plurality of the memory cells; and
  patterning a portion of the ILD layer and filling the patterned portion with the contacts.

8. The method of claim 6, wherein the first impurity doping region and the second impurity doping region are connected through the contacts to be shared by adjacent memory cells.

9. The method of claim 8, wherein the first and second impurity doping regions are formed along both edges of the sub-active regions, and so as not to overlap the sub-gate regions.

10. The method of claim 9, wherein each of the first and second impurity doping regions have a horizontal length that is shorter than a vertical length.

11. The method of claim 10, wherein each of the first and second doping regions have the horizontal length increasing with a vertical downward direction into the insulation region.

12. The method of claim 10, wherein a cross-section of each of the first and second impurity doping regions has an upper horizontal length that is shorter than a lower horizontal length, or a triangle having the horizontal length increasing with a vertical downward direction into the insulation region.

13. The method of claim 9, wherein the first and second impurity doping regions have an impurity density that is uniform in a vertical direction, or a ratio of a maximum impurity density and a minimum impurity density of the first and second impurity doping regions is 10:1 or less in the vertical direction.

14. A method of forming a semiconductor device, the method comprising:
  forming an insulation region on a substrate region, and an active region on the insulation region;
  patterning the active region to form an active line pattern;
  forming a gate pattern to surround an exposed portion of the active line pattern;
  separating the gate pattern into a plurality of sub-gate regions, and separating the active line pattern into a plurality of sub-active regions, to form a plurality of memory cells that are formed of the sub-active regions and the sub-gate regions and that are separated from one another;
  forming first and second impurity doping regions along both edges of the plurality of the sub-active regions; and
  filling a space between the plurality of the memory cells with contacts;
  wherein forming the plurality of memory cells further comprises:
    patterning the gate pattern at predetermined intervals to separate the gate pattern into the plurality of sub-gate regions;
    etching an exposed portion of the active line pattern between the plurality of the sub-gate regions to a predetermined thickness;
    forming a spacer covering the exposed portion of the active line pattern; and
    etching a portion of the active line pattern that is not covered by the spacer and the sub-gate regions to separate the active line pattern into a plurality of sub-active regions.

15. The method of claim 14, wherein the forming of the first and second impurity doping regions comprises doping lateral portions of the sub-active regions.

16. The method of claim 14, wherein the filling of the space between the plurality of the memory cells with contacts, comprises:
  forming an interlayer dielectric (ILD) layer surrounding the plurality of the memory cells; and
  patterning a portion of the ILD layer and filling the patterned portion with the contacts.

* * * * *